United States Patent [19]
Kawahara et al.

[11] Patent Number: 4,829,029
[45] Date of Patent: May 9, 1989

[54] LOW TEMPERATURE SINTERING CERAMIC MATERIAL COMPOSITION AND PROCESS FOR PRODUCING THE LOW TEMPERATURE SINTERING CERAMIC

[75] Inventors: Nobuaki Kawahara; Hiroki Hoshizaki, both of Anjo; Hirofumi Suzuki, Kariya; Kiyomi Kobayashi, Kariya; Makoto Ohkawa, Kariya; Mitsuru Asano, Okazaki, all of Japan

[73] Assignee: Nippondenso Co., Ltd., Kariya, Japan

[21] Appl. No.: 91,981

[22] Filed: Sep. 1, 1987

[30] Foreign Application Priority Data

Sep. 2, 1986 [JP] Japan .................. 61-206609
May 21, 1987 [JP] Japan .................. 62-124160

[51] Int. Cl.$^4$ .............................. C04B 35/04
[52] U.S. Cl. ......................... 501/108; 501/121
[58] Field of Search ........................ 501/108, 121

[56] References Cited

U.S. PATENT DOCUMENTS

| | | | |
|---|---|---|---|
| 683,795 | 10/1901 | Rawson et al. | 501/108 |
| 2,957,752 | 10/1960 | Gloss | 501/108 |
| 3,337,353 | 8/1967 | Alper et al. | 501/108 |
| 3,573,079 | 3/1971 | Shibasaki et al. | 501/108 |

FOREIGN PATENT DOCUMENTS

38-001898 3/1963 Japan .................. 501/108
60-18994 1/1985 Japan .

*Primary Examiner*—William R. Dixon, Jr.
*Assistant Examiner*—Anthony J. Green
*Attorney, Agent, or Firm*—Cushman, Darby & Cushman

[57] ABSTRACT

A low temperature sintering ceramic material, having low temperature sinterability and excellent thermal conductivity, is particularly suitable for use in making an IC substrate of a ceramic printed plate board. This low temperature sintering ceramic material has two composition types. One is a binary composition type ceramic material consisting essentially of MgO and $B_2O_3$, and the other is a ternary composition type ceramic material composed of principal components consisting of MgO and $B_2O_3$ and assisting components consisting of one or more selected from $Li_2O$, $Na_2O$, $K_2O$, a fluoride of an alkali metal and a fluoride of an alkaline earth metal. After sintering, MgO and $B_2O_3$ are respectively contained at 50 to 90 mol% and 10 to 50 mol% on 100 mol% of the total amount of MgO and $B_2O_3$.

5 Claims, 1 Drawing Sheet

LOW TEMPERATURE SINTERING CERAMIC MATERIAL COMPOSITION AND PROCESS FOR PRODUCING THE LOW TEMPERATURE SINTERING CERAMIC

BACKGROUND OF THE INVENTION

1. Field of the Invention

This invention relates to a low temperature sintering ceramic material composition, a process for producing the low temperature sintering ceramic materials, and a ceramic printed plate board using the material as a ceramic substrate. The low temperature sintering ceramic materials of this invention are, for example, particularly useful for a multilayer carrier substrate on which a multilayer substrate IC chip for electronic circuits are mounted.

2. Description of the Prior Art

Requirements have been imposed to improve the packaging density on circuit substrates in accordance with recent advancements in the miniaturization of electronic machines.

In response to such requirements, particularly multilayer wiring using alumina green sheets has already been put to practical use. In this multilayer wiring, alumina green sheets and conductive pattern layers are laminated alternately and then sintered as one body.

Meanwhile, the aforesaid alumina green sheets must be sintered at high temperatures, e.g., in the range of 1500°–1600° C., and therefore the selection of electrode materials have been restricted to metals capable of withstanding high temperatures, such as molybdenum (Mo), tungsten (W) and the like. However, due to the lower electrical conductivity of molybdenum and tungsten rather than silver (Ag) and the like, the miniaturization of the conductive pattern has been limited. Accordingly, alumina could not satisfy the requirements of high packaging density and high speed on an integrated circuit (IC).

Further, conventional low temperature sintering materials capable of being sintered at about 1000° C. have a low thermal conductivity below 0.01 cal/s.cm.° C. For example, alumina glass is sintered at about 900° C. and has a low thermal conductivity of 0.006. Further, ICs and transistors which consume large amounts of electric power could not be mounted on a conventional substrate since the temperature of the element would be elevated by heat from the substrate.

If, however, ceramic materials could be sintered at low temperatures, below 1300° C. and exhibit excellent thermal conductivity, the above mentioned problems could be eliminated.

Among conductive pastes which exhibit excellent thermal conductivity, the silver (Ag)-palladium (Pd) type paste cannot be sintered over 1300° C. If the sintering temperature is decreased below 1000° C., such conductive pastes as silver (Ag), silver (Ag)-platinum (Pt), copper (Cu) and nickel (Ni) can be used.

Japanese Patent Laid-Open No. Showa60-18994 discloses a method for producing an enamel substrate for a printed plate board. In this method, an insulating layer is formed by melting a glass power at temperatures over 700° C. The glass powder has no crystal structure since the glass powder is produced by freezing and solidifying a liquid phase (glass phase) quenched from the completely melted state at 1500° C. However, in general, glass and enamel have a thermal conductivity which is inferior to crystal since no crystal structure is contained therein. Thus, when glass materials are used for the printed plate board, the consumption of electricity of the IC must be decreased.

SUMMARY OF THE PRESENT INVENTION

It is therefore an object of this invention to eliminate the abovementioned problems by providing a ceramic material composition capable of being sintered at low temperatures, below 1300° C. or 1100° C., and a ceramic printed plate board using the material as a ceramic substrate and having excellent thermal conductivity as a result of the sintered body of a crystal phase.

It is another object of this invention to provide a method for producing the ceramic materials disclosed herein.

The present invention provides two types of low temperature sintering ceramic materials suitable for a ceramic substrate. One is a binary composition type, low temperature sintering ceramic material (hereinafter, referred to as binary ceramic materials) and the other is a ternary composition type, low temperature sintering ceramic material (hereinafter, referred to as ternary ceramic materials).

The binary ceramic materials are sintered bodies substantially of a crystal phase and consist essentially of magnesium oxide (MgO) and boron oxide ($B_2O_3$), where MgO is 50 to 90 mol % and $B_2O_3$ is 10 to 50 mol % based on 100 mol % of the total amount of MgO and $B_2O_3$. The composition for producing the binary ceramic materials (hereinafter referred to as binary composition) consists essentially of a magnesium oxide precursor material changed to magnesium oxide (MgO) by calcining and a boron oxide precursor material changed to boron oxide ($B_2O_3$) by calcining, wherein the composition is changed to a sintered body made substantially of a crystal phase, and the MgO is 50 to 90 mol % and the $B_2O_3$ is 10 to 50 mol % based on 100 mol % of the total amount of MgO and $B_2O_3$ after sintering.

The binary ceramic materials have equivalent or better properties with respect to alumina ($Al_2O_3$) in terms of insulation resistance, dielectric constant and thermal expansion. Further, the binary ceramic materials are sintered at low temperatures and therefore are capable of being sintered simultaneously with good conductors such as Ag-Pd type conductors. Thus, the binary ceramic materials are particularly suitable for materials used for a multilayer circuit substrate.

The ceramic printed plate board using the binary ceramic materials as ceramic substrates wherein the ceramic substrate made substantially of a crystal phase and printed wiring are formed in one united body, and the process of the ceramic printed board plate comprises the steps of: (1) mixing a magnesium oxide precursor material changed to MgO by calcining and a boron oxide precursor material changed to $B_2O_3$ by calcining to contain 50 to 90 mol % of the MgO and 10 to 50 mol % of the $B_2O_3$ based on 100 mol % of the total amount of MgO and $B_2O_3$ after sintering, (2) calcining the obtained mixture, (3) making green moldings by molding the calcined materials under pressure, and (4) sintering the green molding integrally after printing with conductive pastes at temperatures of 900° to 1400° C.

To achieve much lower sintering temperature than the binary ceramic materials, the inventors have conducted experiments with various kinds of ceramic materials and have discovered ceramic materials having excellent substrate properties and sintering at low temperatures, below 1100° C. The ceramic materials discovered herein were ternary ceramic materials which are sintered bodies made substantially of a crystal phase. The ternary ceramic materials are composed of principal components consisting of $3MgO \cdot B_2O_3$ and MgO and assisting components consisting of one or more selected from $Li_2O$, $Na_2O$, $K_2O$, a fluoride of an alkali metal and a fluoride of an alkaline earth metal.

The ternary ceramic materials, capable of being sintered at lower temperatures than the binary ceramic materials, are composed of the principal components consisting of MgO of 50 to 90 mol % and $B_2O_3$ of 10 to 50 mol % and the assisting components consisting of one or more selected from $Li_2O$, $Na_2O$, $K_2O$, a fluoride of an alkali metal and a fluoride of an alkaline earth metal. The composition for producing the ternary ceramic materials is composed of principal compound materials consisting essentially of a magnesium oxide precursor material changed to magnesium oxide (MgO) by calcining and a boron oxide precursor material changed to boron oxide ($B_2O_3$) by calcining and assisting compound materials consisting of one or more materials selected from a lithium oxide precursor material changed to lithium oxide ($Li_2O$) by calcining, a sodium oxide precursor material changed to sodium oxide ($Na_2O$) by calcining, a potassium oxide precursor material changed to potassium oxide ($K_2O$) by calcining, a fluoride of an alkali metal and a fluoride of an alkaline earth metal, wherein the composition is changed to a sintered body made substantially of a crystal phase by sintering and the MgO is 50 to 90 mol % and the $B_2O_3$ is 10 to 50 mol % based on 100 mol % of the total amount of the principal compound materials after sintering.

The ceramic printed plate board using the ternary ceramic material as a ceramic substrate wherein the ceramic substrate is made substantially of a crystal phase and printed wiring are formed in one united body, and the process of the ceramic printed plate board comprises the steps of (1) mixing principal compound materials consisting of a magnesium oxide precursor material changed to magnesium oxide (MgO) by calcining and a boron oxide precursor material changed to boron oxide ($B_2O_3$) by calcining, and assisting compound materials consisting of one or more materials selected from a lithium oxide precursor material changed to lithium oxide ($Li_2O$) by calcining, a sodium oxide precursor material changed to sodium oxide ($Na_2O$) by calcining, a potassium oxide precursor material changed to potassium oxide ($K_2O$) by calcining, a fluoride of an alkali metal and a fluoride of an alkaline earth metal to contain 50 to 90 mol % of the MgO and 10 to 50 mol % of the $B_2O_3$ based on 100 mol % of the total amount of said principal compound materials after sintering, (2) calcining the obtained mixture, (3) making green moldings by molding said calcined materials under pressure, and (4) sintering the green moldings integrally after printing with conductive pastes at temperatures of 900° to 1100° C.

Meanwhile, the process for producing the binary ceramic materials comprises the steps of:
(1) mixing materials of MgO and $B_2O_3$ to achieve a given composition ratio between MgO and $B_2O_3$,
(2) calcining the obtained mixture, and
(3) molding the calcined mixtures under pressure, and
(4) sintering at temperatures of 900° to 1400° C.

As to the process for producing of the ternary ceramic materials, principal components consisting of MgO and $B_2O_3$ and assisting components consisting of one or more components selected from $Li_2O$, $Na_2O$, $K_2O$, a fluoride of an alkali metal and a fluoride of an alkaline earth metal are mixed to achieve a given composition ratio and then the same steps as the process for producing the binary ceramic materials are conducted.

DETAILED DESCRIPTION OF THE PRESENT INVENTION

Figure 1:
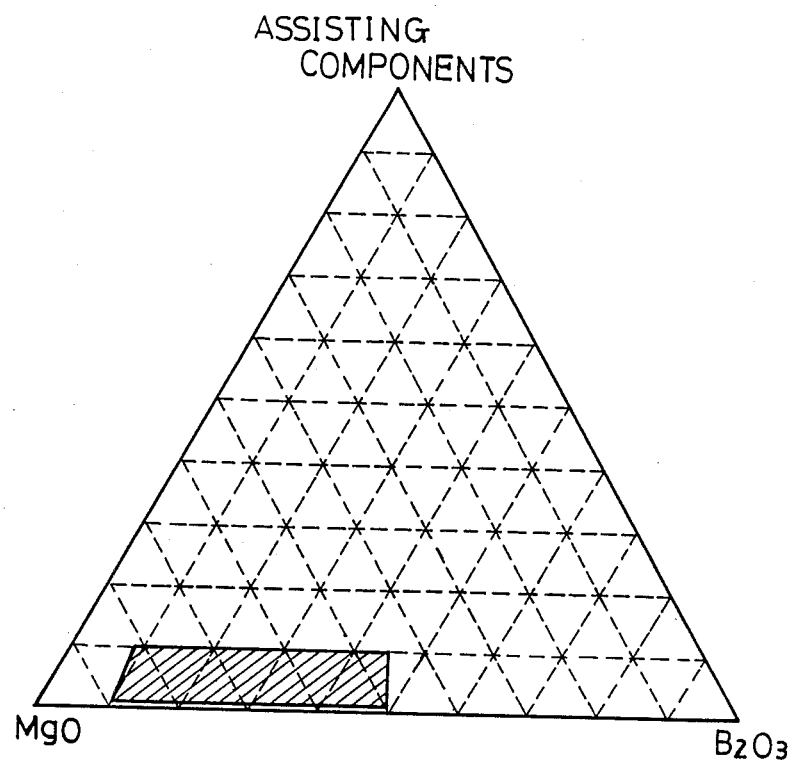
FIG. 1 is a ternary compositional diagram showing the composition ratio (within the trapezoidal region marked with diagonal lines) of each component of ternary compositional low temperature sintering ceramic materials composed of principal components of MgO and $B_2O_3$ and assisting components.

The binary ceramic materials of this invention are substantially made of a crystal phase and consist essentially of MgO and $B_2O_3$, where MgO is 50 to 90 mol % and $B_2O_3$ is 10 to 50 mol % based on 100 mol % of the total amount of MgO and $B_2O_3$ after sintering.

In this invention, MgO and $B_2O_3$ mean chemical components contained is a sintered ceramic material and can exist in the state of a composite oxide such as $MgO \cdot B_2O_3$ or a single oxide such as MgO. The oxides can be used as a blending material before calcining. Also, carbonates and hydroxides, which change to oxides after calcining, can be used as a blending material before calcining.

Originally, MgO is a circuit substrate material having excellent thermal conductivity and insulating properties. However, MgO has the disadvantages of high sintering temperatures over 1600° C. and a large thermal expansion.

In this invention, it is possible to achieve a thermal conductivity of more than 0.01 cal/s.cm.° C., low sintering temperatures below 1300° C. and a low thermal expansion ratio by sintering MgO with $B_2O_3$.

To achieve the low sintering temperature, various types of ceramic materials were examined. The results showed that the ceramic having $MgO \cdot B_2O_3$, $2MgO \cdot B_2O_3$ and $3MgO \cdot B_2O_3$ as principal components is sintered below 1300° C. and exhibits high thermal conductivity and excellent substrate properties compared to the conventional low temperature sintering materials.

A certain composition ratio of MgO and $B_2O_3$ is required to achieve the low sitering temperature and excellent substrate properties. That is, MgO must be 50 to 90 mol % and $B_2O_3$ must be 10 to 50 mol % based on 100 mol % of the total amount of MgO and $B_2O_3$. If $B_2O_3$ exceeds 50 mol % and MgO is less than 50 mol %, the thermal expansion ratio becomes less than 0.01 because $B_2O_3$ exists in the glass state and therefore the substrate property cannot be improved. If the amount of $B_2O_3$ falls below 10 mol % and the amount of MgO exceeds 90 mol %, the low sintering temperature cannot be achieved since the independently existing MgO component is increased and therefore sintering below 1300° C. cannot be achieved.

The binary ceramic materials have an excellent thermal conductivity due to the sintered body made substantially of a crystal phase, whereas the glass phase does not have excellent thermal conductivity. Therefore, the binary ceramic materials have a low sintering temperature, below 1300° C., an excellent thermal conductivity and equivalent or better properties with respect to alumina ($Al_2O_3$) in terms of insulation resistance, thermal expansion ratio and dielectric constant. Accordingly, the binary ceramic materials are capable of being sintered simultaneously with good conductors such as an Ag-Pb type conductor and useful for a multilayer circuit substrate.

The ternary ceramic materials, capable of being sintered at lower temperatures than the binary ceramic materials, are composed of the principal components consisting of MgO of 50 to 90 mol % and $B_2O_3$ of 10 to 50 mol % and the assisting components consisting of one or more components selected from $Li_2O$, $Na_2O$, $K_2O$, a fluoride of an alkali metal and a fluoride of an alkaline earth metal.

Meanwhile, the trapezoidal region marked with diagonal lines in the ternary compositional diagram of FIG. 1 shows the composition ratio of the ternary ceramic materials which are composed of the principal components consisting of MgO and $B_2O_3$ and the assisting components.

In the ternary ceramic materials of this invention, the substrate properties can be ensured and the sintering temperature can be lowered below 1100° C. by adding a predetermined amount of assisting components such as $Li_2O$ to the binary ceramic materials. While, in the binary ceramic materials, for example, mixture type materials consisting of $3MgO.B_2O_3$ and MgO (herein, $B_2O_3$ is 10 to 25 mol %) have a relatively high sintering temperature of 1200° to 1300° C., although the mixture type materials are characterized by a high thermal conductivity and an almost equivalent thermal expansion coefficient to that of $Al_2O_3$, resulting from the properties of MgO. However, the sintering temperature of the mixture type materials could be reduced below 1100° C. by adding assisting components consisting of one or more components selected from $Li_2O$, $Na_2O$ and $K_2O$ to the mixture type materials.

Further, when a fluoride of an alkali metal or an alkaline earth metal is used as an assisting component, the packaging density can be remarkably improved while keeping the low sintering temperatures, below 1100° C. without worsening the substrate properties. In the ternary ceramic materials, each component such as MgO, $B_2O_3$, $Li_2O$, $Na_2O$ and $K_2O$ is a chemical component contained in a sintered ceramic material and can exist in the state of a composite oxide such as $MgO.B_2O_3$ or a single oxide such as MgO. As a blending material before calcining, oxides can be used as well as carbonates and hydroxides which are changed into oxides after calcining.

While, a fluoride of an alkali metal or an alkaline earth metal is, for example, LiF, NaF, $CaF_2$ and $Na_3AlF_6$, and is a chemical component contained in a sintered ceramic material.

As described above, the assisting components can consist of at least one component selected from $Li_2O$, $Na_2O$, $K_2O$, a fluoride of an alkali metal and a fluoride of an alkaline earth metal, and different effects are not produced even if more than two types of the above described components are selected as assisting components.

In the ternary ceramic materials, in particularly when the assisting components consist of one or more components selected from $Li_2O$, $Na_2O$, $K_2O$ and the like, the sintering temperature is decreased sharply upon the addition of a predetermined amount of an assisting component, however, the thermal conductivity is not reduced as much. This means that both the low sintering temperature and high thermal conductivity are achieved at the same time. That is, sintering at low temperatures is achieved because $LiMgBO_3$ having a low melting point is formed by adding assisting components such as $Li_2O$. Also, the high thermal conductivity is achieved because the sintered body is made substantially of a crystal phase and almost no glass phase is contained therein.

Whereas, in the case where the assisting components consist of fluorides of alkali metal or alkaline earth metal, the ternary ceramic materials can be sintered at low temperatures without decreasing the thermal conductivity by adding a predetermined amount of the assisting components and it can be possible to achieve high density together with high thermal conductivity. The low sintering temperature is achieved because a liquid phase containing fluoride as a principal component is formed in a grain boundary at the sintering temperature by adding a small amount of fluoride. Further, high thermal conductivity and high density can be achieved since the sintered structure is made substantially of a crystal phase and no glass phase is contained therein.

Therefore, the ternary ceramic materials of this invention, are capable of being sintered simultaneously with good conductor pastes such as Ag and Ag-Pt type conductors, and are more suitable for a multilayer circuit substrate than conventional materials.

As described above, both binary and ternary ceramic materials of this invention are excellent to be used in an IC substrate which requires high density and high speed since those ceramic materials have low sintering temperatures and excellent thermal conductivity compared to conventional materials, and the miniaturization of a conductive pattern and elimination of the heat generated in the element is facilitated. Accordingly, the ceramic printed plate board of the present invention using the above mentioned ternary ceramic materials as an IC substrate is extremely useful.

Further, the method according to the present invention allows one to produce the low temperature sintering ceramic material having the aforementioned advantages.

DETAILED DESCRIPTION OF THE PREFERRED EMBODIMENTS

Having generally described this invention, a further understanding can be obtained by reference to certain specific examples which are provided herein for purposes of illustration only and are not intended to be limiting unless otherwise specified.

TEST EXAMPLE 1

Test Example 1 relates to the binary ceramic materials of this invention.

In this Example 1, each ceramic material, in which a different amount of $B_2O_3$ was added to MgO, was prepared and examined for thermal conductivity, dielectric constant and thermal expansion ratio.

As the powdered material of the present invention, MgO and $B_2O_3$ can be used as well as materials which are changed into oxides after calcining, such as carbonates and hydroxides. In Test Example 1, powdered materials of magnesium hydroxide ($Mg(OH)_2$) and boric acid ($H_3BO_3$) were prepared in the composition ratio as shown in Table 1, and charged into an alumina pot with alumina balls and thereafter wet mixed by the ball mill for 8 hours. The mixture was then dry milled in an alumina mortar after calcining at 600° C. for four hours. Polyvinyl alcohol was added as a binder during granulation. Thereafter, the granules were charged into a die and subjected to molding under a pressure of about 1t/cm². Then, eight kinds of test samples (Nos. 1 to 8) were produced after sintering for two hours at 900° to 1400° C. in the atmospheric air. In these test samples, No. 7 is a material consisting of alumina and No.8 is a material consisting of alumina glass.

Then from the test samples, a sample disc of 12 mm $\phi \times 1$ mm t was made for measuring the thermal conductivity, dielectric constant and dielectric loss, and a sample bar of 50 mm $\phi \times 5$ mm $\times 5$ mm was made for measuring the thermal expansion ratio and material strenght.

The thermal conductivity was measured by the laser flash method, the dielectric constant and dielectric loss were measured at 1 MHz by using a circular electrode. This circular electrode was produced by the following steps; first, silver paste was printed in the shape of concentric circles on both sides of the sample disc by the 250 mesh screen printing, then the printed silver paste was dried, then the sample disc with printed silver paste was sintered at 760° C. in the atmospheric air. The thermal expansion coefficient was measured by varying the temperature within the range of 20° C. to 200° C. The results of the measurement are shown in Table 1.

becomes impossible. Accordingly, when the amount of $B_2O_3$ is within the range of 10 to 50 mol %, both low temperature sintering below 1300° C. and high thermal conductivity can be ensured simultaneously.

Thus, with the aforementioned process and composition, it becomes possible to obtain a circuit substrate with a low sintering temperature, below 1300° C. Further, this circuit substrate, as shown in Table 1 (sample Nos. 2 to 5), has excellent properties as well as alumina, for example, a thermal expansion ratio of $7.0-7.6 \times 10^{-6}/°$ C. and thermal conductivity of 0.01–0.05 cal/s.cm.° C. Both the dielectric constant and dielectric loss are less than that of alumina. Also, this circuit substrate is sufficiently suited for use as a ceramic substrate since simultaneous sintering with commercially available conductor paste is possible and the curvature appearing in simultaneous sintering is small. Also, this substrate has sufficient strenght such as greater than 1000 kg/cm² of the three point bending resistance strength. Also, due to the excellent thermal conductivity, this substrate can be used for a ceramic substrate for mounting the element with a large electric power consumption and high calorific power.

Next, the raw compound materials were calcined and atomized. Then the calcined and atomized materials were molded under pressure to make green molding sheets. After the conductive pastes were printed, the green molding sheets were sintered integrally, thus producing ceramic printed plate boards.

Figure 2:
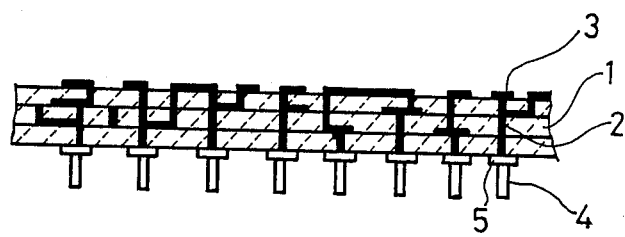
FIG. 2 is a cross-sectional view of a ceramic printed plate board according to the present invention.

FIG. 2 shows a cross-sectional view of the ceramic printed plate board. A laminated layer portion 1 com-

TABLE 1

| SAMPLE NO. | 1 | 2 | 3 | 4 | 5 | 6 | 7 | 8 |
|---|---|---|---|---|---|---|---|---|
| MgO—xmol % $B_2O_3$ | 5 | 10 | 25 | 33.3 | 50 | 55 | alumina | alumina glass |
| Sintering temperature (°C.) | 1450 | 1300 | 1225 | 1075 | 1000 | 950 | 1600 | 900 |
| Composition | MgO + $3MgO.B_2O_3$ | MgO + $3MgO.B_2O_3$ | $3MgO.B_2O_3$ | $2MgO.B_2O_3$ | $MgO.B_2O_3$ | $MgO.B_2O_3$ + glass | 96% alumina | alumina + borosilicate flint glass |
| Sintering density (g/cm³) | 2.99 | 2.94 | 2.58 | 2.52 | 2.31 | 1.91 | 3.70 | 3.12 |
| Thermal expansion ratio ($10^{-6}$/°C.) | 9.9 | 7.6 | 7.3 | 7.2 | 7.0 | 6.4 | 7.0 | 4.2 |
| Thermal conductivity (cal/s.cm.°C.) | 0.075 | 0.049 | 0.014 | 0.013 | 0.011 | 0.004 | 0.04 | 0.006 |
| Dielectric constant | 8.1 | 6.8 | 5.6 | 5.4 | 5.1 | 4.9 | 9.6 | 7.5 |
| Dielectric loss | 0.0005 | 0.0009 | 0.001 | 0.001 | 0.001 | 0.005 | 0.0003 | 0.003 |
| Total evaluation | X | O | O | O | O | X | X | X |

The composition of each sintered test = sample was obtained from the results of X-ray analysis. The bottom of Table 1 shows the total evaluation in which a circle means good results, and a cross means bad results. Table 1 shows that the sintering temperature, thermal expansion ratio, thermal conductivity and dielectric constant tend to be lowered in accordance with an increase in the amount of $B_2O_3$. In the case where the amount of $B_2O_3$ exceeds 50 mol %, a glass phase is produced in the structure and therefore, the thermal conductivity is reduced remarkably. On the other hand, in the case where the amount of $B_2O_3$ is less than 10 mol %, the sintering temperature is over 1300° C., and therefore, simultaneous sintering with an Ag-Pd type conductor prising three ceramic sheets is formed on the printed plate board. The laminated layer portion 1 has inner wiring conductors 2 comprising tungsten or molybdenum for wiring in a direction of substrate thickness and surface wiring conductors 3 for providing a certain wiring on the surface. The surface wiring conductors 3 are formed, for example, by printing. On the other surface of the laminated layer portion 1 where the surface wiring conductors are not formed, junction 5 for joining output and input terminals 4 are formed to exchange signals between the printed plate board and the outside.

The ceramic printed boards were extremely useful because the binary ceramic materials having the abovementiond features were used as a ceramic substrate.

TABLE 2

| Sample No. | 9 | 10 | 11 | 12 | 13 | 14 | 15 | 16 | 17 | 18 |
|---|---|---|---|---|---|---|---|---|---|---|
| MgO—xmol % $B_2O_3$ | 20 | 20 | 20 | 20 | 20 | 20 | 20 | 30 | 40 | alumina (96%) |
| $Li_2O$ (mol %) | 0.5 | 1.0 | 2.0 | 3.0 | 5.0 | 10.0 | 11.0 | 3.0 | 3.0 | |
| Sintering temperature (°C.) | 1250 | 1100 | 950 | 950 | 950 | 950 | 950 | 950 | 950 | 1600 |
| Thermal expansion ratio ($10^{-6}$/°C.) | 8.0 | 8.0 | 7.6 | 7.6 | 7.3 | 7.1 | 7.1 | 6.9 | 6.7 | 7.0 |
| Thermal conductivity (cal/s.cm.°C.) | 0.04 | 0.04 | 0.04 | 0.037 | 0.036 | 0.033 | 0.03 | 0.028 | 0.017 | 0.04 |
| Dielectric constant | 6.7 | 6.7 | 6.7 | 6.9 | 7.1 | 7.6 | 7.6 | 6.4 | 6.1 | 9.6 |
| Insulation resistance (ohm cm) | >$10^{13}$ | >$10^{13}$ | >$10^{13}$ | >$10^{13}$ | 8 × $10^{12}$ | 2 × $10^{12}$ | 5 × $10^{11}$ | >$10^{13}$ | >$10^{13}$ | >$10^{13}$ |
| Total evaluation | Δ | O | O | O | O | O | Δ | O | O | X |

TABLE 3

| Sample No. | 19 | 20 | 21 |
|---|---|---|---|
| MgO—xmol % $B_2O_3$ | 20 | 20 | 20 |
| $Na_2O$ (mol %) | 1 | 3 | 5 |
| Sintering temperature (°C.) | 975 | 925 | 850 |
| Thermal expansion ratio ($10^{-6}$ %) | 8.0 | 7.5 | 7.4 |
| Thermal conductivity (cal/s.cm.°C.) | 0.04 | 0.02 | 0.01 |
| Dielectric constant | 6.7 | 7.2 | 7.3 |
| Insulation resistance (ohm · cm) | >$10^{13}$ | 2 × $10^{12}$ | $10^{12}$ |
| Total evaluation | O | O | O |

TABLE 4

| Sample No. | 22 | 23 |
|---|---|---|
| MgO—xmol % $B_2O_3$ | 20 | 20 |
| $K_2O$ (mol %) | 1 | 5 |
| Sintering temperature (°C.) | 950 | 825 |
| Thermal expansion ratio ($10^{-6}$ %) | 8.0 | 7.5 |
| Thermal conductivity (cal/s.cm.°C.) | 0.04 | 0.02 |
| Dielectric constant | 6.6 | 7.4 |
| Insulation resistance (ohm · cm) | >$10^{13}$ | 3 × $10^{12}$ |
| Total evaluation | O | O |

TABLE 5

| Sample No. | 24 | 25 | 26 | 27 | 28 | 29 | 30 | 31 | 32 | 33 |
|---|---|---|---|---|---|---|---|---|---|---|
| MgO—xmol % $B_2O_3$ | 20 | 20 | 20 | 20 | 20 | 20 | 10 | 10 | 50 | 50 |
| LiF (mol %) | 0.5 | 1 | 3 | 5 | 10 | 11 | 1 | 10 | 1 | 10 |
| Sintering temperature (°C.) | 1300 | 1100 | 1000 | 950 | 930 | 900 | 1100 | 1040 | 950 | 850 |
| Thermal conductivity (cal/s.cm.°C.) | 0.042 | 0.041 | 0.040 | 0.036 | 0.020 | 0.015 | 0.043 | 0.039 | 0.012 | 0.010 |
| Water absorption ratio (%) | 3.0 | 0.0 | 0.0 | 0.0 | 0.0 | 0.0 | 0.0 | 0.0 | 0.0 | 0.0 |
| Insulation resistance (ohm · cm) | >$10^{13}$ | >$10^{13}$ | >$10^{13}$ | >$10^{13}$ | >$10^{13}$ | 2 × $10^9$ | >$10^{13}$ | >$10^{13}$ | >$10^{13}$ | >$10^{13}$ |
| Total evaluation | Δ | O | O | O | O | Δ | O | O | O | O |

TABLE 6

| Sample No. | 34 | 35 |
|---|---|---|
| MgO—xmol % $B_2O_3$ | 20 | 40 |
| NaF (mol %) | 5 | 5 |
| Sintering temperature (°C.) | 950 | 900 |
| Thermal conductivity (cal/s.cm.°C.) | 0.018 | 0.013 |
| Water absorption ratio (%) | 0.0 | 0.0 |
| Insulation resistance (ohm · cm) | >$10^{13}$ | >$10^{13}$ |
| Total evaluation | O | O |

TABLE 7

| Sample No. | 36 | 37 | 38 | 39 | 40 | 41 | 42 | 43 |
|---|---|---|---|---|---|---|---|---|
| MgO—xmol % $B_2O_3$ | 20 | 20 | 20 | 20 | 10 | 10 | 50 | 50 |
| $Na_3AlF_6$ (mol %) | 0.5 | 1 | 10 | 11 | 1 | 10 | 1 | 10 |
| Sintering temperature (°C.) | 1250 | 1100 | 900 | 900 | 1100 | 1050 | 950 | 850 |
| Thermal conductivity (cal/s.cm.°C.) | 0.036 | 0.035 | 0.020 | 0.010 | 0.039 | 0.025 | 0.014 | 0.006 |
| Water absorption ratio (%) | 0.4 | 0.0 | 0.0 | 0.0 | 0.0 | 0.0 | 0.0 | 0.0 |
| Insulation resistance (ohm · cm) | >$10^{13}$ | >$10^{13}$ | >$10^{13}$ | 5 × $10^{11}$ | >$10^{13}$ | >$10^{13}$ | >$10^{13}$ | 5 × $10^{12}$ |
| Total evaluation | Δ | O | O | Δ | O | O | O | O |

TABLE 8

| Sample No. | 44 | 45 | 46 | 47 | 48 | 49 | 50 | 51 | 52 |
|---|---|---|---|---|---|---|---|---|---|
| MgO—xmol % $B_2O_3$ | 20 | 20 | 20 | 20 | 20 | 10 | 10 | 50 | 50 |
| $CaF_2$ (mol %) | 0.5 | 1 | 5 | 15 | 16 | 1 | 15 | 1 | 15 |
| Sintering temperature | 1300 | 1100 | 1050 | 1000 | 1000 | 1100 | 1050 | 1000 | 950 |

TABLE 8-continued

| Sample No. | 44 | 45 | 46 | 47 | 48 | 49 | 50 | 51 | 52 |
| --- | --- | --- | --- | --- | --- | --- | --- | --- | --- |
| (°C.) Sintering temperature (cal/s.cm.°C.) | 0.041 | 0.040 | 0.030 | 0.010 | 0.007 | 0.041 | 0.015 | 0.013 | 0.006 |
| Water absorption ratio (%) | 4.0 | 0.0 | 0.0 | 0.0 | 0.0 | 0.0 | 0.0 | 0.0 | 0.0 |
| Insulation resistance (ohm · cm) | >$10^{13}$ | >$10^{13}$ | >$10^{13}$ | $5 \times 10^{12}$ | $10^{10}$ | >$10^{13}$ | >$10^{13}$ | >$10^{13}$ | $2 \times 10^{12}$ |
| Total evaluation | Δ | O | O | O | Δ | O | O | O | O |

TEST EXAMPLE 2

Test Example 2 relates to the ternary ceramic materials.

In this Test Example 2, the sintering temperatures and certain properties such as the thermal expansion ratio of ceramic materials having different amounts of $Li_2O$, $Na_2O$ and $K_2O$ as assisting components were measured. The results of the measurements are shown in Tables 2 to 4. In the same manner, the sintering temperatures and certain properties of ceramic materials having different amounts of fluoride such as LiF, NaF and $Na_3AlF_6$ as assisting components were measured and the results are shown in Tables 5 to 7. Also, the sintering temperatures and certain properties of ceramic materials having different amounts of fluoride such as $CaF_2$ as assisting components were measured and the results are shown in Table 8. In Tables 2 to 8, is showing the results of the addition of $Li_2O$, Table 3 is $Na_2O$, Tablet 4 is $K_2O$, Table 5 is LiF, Table 6 is NaF, Table 7 is $Na_3AlF_6$ and Table 8 is $CaF_2$. The bottom portion of Tables 2 to 8 show the total evaluation in which a circle means good, triangle means fair, and cross means bad.

Samples used in this Test Example 2 (Nos. 9 to 18 shown in Table 2, Nos. 19 to 21 in Table 3 and Nos. 22 to 23 in Table 4) were produced in the same manner as Test Example 1 except for an addition of a predetermined amount of assisting components and also each properties of the samples were measured in the same manner as Test Example 1. Also, samples (Nos.24 to 33 in Table 5, Nos. 34 to 35 in Table 6, Nos. 36 to 43 in Table 7 and Nos. 44 to 52 in Table 8) were produced in the same manner as Test Example 1 except for an addition of a predetermined amount of assisting components and the properties of the samples were measured in the same manner as Test Example 1. In Tables 5 to 8, the water absorption ratio was measured to examine the density of each ceramic material. The water absorption ratio was measured by soaking the sample into pure water for one hour and measuring the weight difference of the sample between after soaking and before soaking. Meanwhile, No. 18 was a material consisting of alumina.

The effect by the addition of $Li_2O$

Three kinds of composition ratio of $B_2O_3$ to the total amount of MgO and $B_2O_3$, such as 20, 30 and 40 mol % were used as shown in Nos. 9 to 15, 16 and 17. The composition ratios were within the range of 10 to 50 mol %. The composition ratio of $Li_2O$ was 0.5 to 11.0 mol % based on 100 mol % of the total amount of MgO, $B_2O_3$ and $Li_2O$.

Table 2 shows the results of the $Li_2O$ added samples. In sample No. 9 with 0.5 mol % of $Li_2O$, the $Li_2O$ had little effect. Whereas, in sample No. 15 with 11 mol % of $Li_2O$, the insulating property of the material were worsened. The effect to lower sintering temperatures was produced in the case where the amount of $Li_2O$ was 1 mol % or more and the sufficient sintering was ensured at 950° C. in the case of more than 2 mol %. While, as can be determined by Table 2, the relationship between the amount of $Li_2O$ and the sintering temperature are almost unchangeable even if the composition ratio between MgO and $B_2O_3$ is changed.

Meanwhile, alumina glass (alumina+ borosilicate flint glass: No. 8 in Table 1) is generally known as a conventional low temperature sintering material capable of being sintered at 900° C. This sample No. 8 had quite a low thermal conductivity of 0.006, however, samples Nos. 10 to 17 showed an excellent thermal conductivity when compared to this conventional low temperature sintered material.

Now, the properties of the samples having $Li_2O$ will be described according to sample No. 11 with the composition of MgO - 20mol % of $B_2O_3$ -2mol % of $Li_2O$. As shown in Table 2, No. 11 has excellent properties such as a thermal conductivity of 0.04 cal/s.cm.° C. and a thermal expansion ratio of $7.6 \times 10^{-6}$/° C., as well as alumina, and a low sintering temperature at 950° C. Also, simultaneous sintering with the conductor paste for commercially available alumina such as Ag, Cu, Ag-Pd and Ag-Pb type conductor paste was possible, and the curvature that appeared in simultaneous sintering was small. Thus, it is apparent that sample No. 11 is particularly suitable for a multilayer circuit substrate. As to the material strength, also No. 11 has sufficient strength such as more than 1200 kg/cm² of three point bending resistance strength.

The effect by the addition of $Na_2O$ and $K_2O$

To the mixture of 80 mol % of MgO and 20 mol % of $B_2O_3$, $Na_2O$ was added and the results are shown Table 3. In the same manner, $K_2O$ was added and the results are shown in Table 4.

According to the results, the addition of $Na_2O$ and $K_2O$ showed almost the same effects as the addition of $Li_2O$. While, as to the thermal conductivity, $K_2O$ (e.g., sample No. 23) and $Na_2O$ (e.g., sample No. 21) have lower thermal conductivity than $Li_2O$ (e.g., sample No. 13). ($Na_2O$ has lower thermal conductivity than $Li_2O$.) Nevertheless, their thermal conductivity were quite high when compared to sample No. 8 (shown in Table 1) which is a conventional material consisting of alumina glass capable of being sintered at low temperatures.

The effect by the addition of LiF

As composition ratio of $B_2O_3$ to the total amount of MgO and $B_2O_3$, samples with three kinds of composition ratio, 10, 20 and 50 mol % were used as shown in Nos. 30 to 31, 24 to 29 and 32 to 33. Those composition ratios were within the present inventions range of 10 to 50 mol %. The composition ratio of LiF was 0.5 to 11 mol % based on 100 mol % of the total amount of MgO, $B_2O_3$ and LiF.

Table 5 shows the results of LiF added samples. In sample No. 24 with 0.5 mol % of LiF, the LiF had little effect and the sintering temperature was not lowered. Whereas, in sample No. 29 with 11 mol % of LiF, the insulating property had worsened.

It can be determined from sample Nos. 24 to 33 in Table 5, that the ceramic materials with low sintering temperatures and high density indicated by 0% of water absorption ratio could be obtained independently of the composition ratio between MgO and $B_2O_3$.

The effect by the addition of NaF

NaF was added to the mixture of MgO and $B_2O_3$ with a given composition ratio and the results are shown in Table 6. NaF is a fluoride of Na, the same alkali metal as Li. According to the results, the addition of NaF showed almost the same effects as LiF.

The effect by the addition of $Na_3AlF_6$ $Na_3AlF_6$ was added to the mixture of MgO and $B_2O_3$ with a given composition ratio and the results are shown in Table 7. In this place, $Na_3AlF_6$ is a fluoride containing Na, an alkali metal.

It can be determined from Table 7, the $Na_3AlF_6$ had little effect and the sintering temperature was relatively high in sample No. 36 with 0.5 mol % of $Na_3AlF_6$. Whereas, in sample No. 39 with 11 mol % of $Na_3AlF_6$, the insulating property of the material had worsened. That is, by adding the $Na_3AlF_6$ of 1 to 10 mol % to the mixture of MgO and $B_2O_3$ with a given composition ratio, the ceramic materials having low sintering temperature and high density could be obtained. Meanwhile, the relationship between the amount of $Na_3AlF_6$ and the sintering temperature was varied independently of the composition ratio between MgO and $B_2O_3$.

The effect by the addition of $CaF_2$ 0.5 to 16 mol % of $CaF_2$ was added to the mixture of MgO and $B_2O_3$ with a given composition ratio. $CaF_2$ is a fluoride of an alkaline earth metal. The results are shown in Table 8. In sample No. 44 with 0.5 mol % of $CaF_2$, the $CaF_2$ had little effect and the sintering temperature was not lowered. Whereas, in sample No. 48 with 16 mol % of $CaF_2$, the insulating property of material had worsened.

As can be determined from sample Nos. 44 to 52 in Table 8, the ceramic materials with low sintering temperature and high density indicated by 0% of water absorption ratio could be obtained by adding 1 to 15 mol % of $CaF_2$, independently of the composition ratio between MgO and $B_2O_3$ was changed.

The printed plate board using the ternary ceramic materials as a ceramic substrate were produced by the same method as in Example 1, using the abovementioned compound material. The ceramic printed plate board were most useful because the ceramic substrate is made by the ternary ceramic materials having the abovementioned features.

Obviously, many modifications and variations of the present invention are possible in the light of the above teachings. It is therefore to be understood that within the scope of the appended claims, the invention may be practiced otherwise than as specifically described.

What is claimed is:

1. A composition for low temperature sintering ceramic materials which are used as a printed plate body composed of principal compound materials consisting essentially of a magnesium oxide precursor material changed to magnesium oxide (MgO) by calcining and a boron oxide precursor material changed to boron oxide ($B_2O_3$) by calcining and assisting compound materials consisting essentially of one or more selected from the group consisting of a lithium oxide precursor material changed to lithium oxide ($Li_2O$) by calcining, a sodium oxide precursor material changed to sodium oxide ($Na_2O$) by calcining, a potassium oxide precursor material changed to potassium oxide ($K_2O$) by calcining, a fluoride of an alkali metal and a fluoride of an alkaline earth metal, wherein said principal compound materials are not more than 99 mol % and said assisting compound materials are not less than 1 mol % based on 100 mol % of a total amount of said principal and assisting compound materials, said composition is changed to a sintered body made substantially of a crystal phase by sintering and the sintered body consists essentially of magnesium oxide, boron oxide and one or more selected from the group consisting of lithium oxide, sodium oxide, potassium oxide, a fluoride of an alkali metal, and a fluoride of an alkaline earth metal and said MgO is 50 to 90 mol % and said $BH_2O_3$ is 10 to 50 mol % based on 100 mol % a total amount of said principal compound materials after sintering.

2. A composition for low temperature sintering ceramic materials which are used as a printed plate body composed of principal compound materials consisting essentially of a magnesium oxide precursor material changed to magnesium oxide (MgO) by calcining and a boron oxide precursor material changed to boron oxide ($B_2O_3$) by calcining and assisting compound materials consisting essentially of one or more materials selected from the group consisting of lithium oxide, sodium oxide, potassium oxide, a fluoride of an alkali metal and a fluoride of an alkaline earth metal, wherein said principal compound materials as 90 to 99 mol % and said assisting compound materials are 1 to 10 mol % based on 100 mol % of a total of said principal and assisting compound materials, said composition is changed to a sintered body made substantially of a crystal phase by sintering, the sintered body consists essentially of magnesium oxide, boron oxide, and one or more selected from the group consisting of lithium oxide, sodium oxide, potassium oxide, a fluoride of an alkali metal, and a fluoride of an alkaline earth metal, and said MgO is 50 to 90 mol % and said $B_2O_3$ is 10 to 50 mol % based on 100 mol % of a total amount of said principal compound materials after sintering.

3. A composition for low temperature sintering ceramic materials which are used as a printed plate body composed of principal compound materials consisting essentially of a magnesium oxide precursor material changed to magnesium oxide (MgO) by calcining and a boron oxide precursor material changed to boron oxide ($B_2O_3$) by calcining and assisting compound materials consisting essentially of a fluoride of an alkaline earth metal and optionally one or more materials selected from the group consisting of lithium oxide, sodium oxide, potassium oxide, and a fluoride of an alkali metal, wherein said principal compound materials are 85 to 99 mol % and said assisting compound materials are 1 to 15 mol % based on 100 mol % of a total of said principal and assisting compound materials, said composition is changed to a sintered body made substantially of a crystal phase by sintering, the sintered body consists essentially of magnesium oxide, boron oxide, and a fluoride of an alkaline earth metal and optionally one or more materials selected from the group consisting of lithium oxide, sodium oxide, potassium oxide, a fluoride of an alkali metal, and said MgO is 50 to 90 mol % and said $B_2O_3$ is 10 to 50 mol % based on 100 mol % of a total amount of said principal compound materials after sintering.

4. A process for producing a low temperature sintered ceramic body consisting essentially of magnesium oxide, boron oxide and one or more materials selected from the group consisting of lithium oxide, sodium oxide, potassium oxide, a fluoride of an alkali metal and a fluoride of an alkaline earth metal, said process consisting essentially of the steps of:

(1) mixing principal compound materials consisting essentially of a magnesium oxide precursor material changed to magnesium oxide by calcining and a boron oxide precursor material changed to boron oxide by calcining and assisting compound materials consisting essentially of one or more materials selected from lithium oxide, sodium oxide, potassium oxide, a fluoride of an alkali metal and a fluoride of an alkaline earth metal, to contain 50 to 90 mol % of said magnesium oxide and 10 to 50 mol % of said boron oxide based on 100 mol % of a total amount of said principal compound materials after sintering, said principal compound materials being 90 to 99 mol % and said assisting compound materials being 1 to 10 mol % based on 100 mol % of a total of said principal and assisting compound materials, (2) calcining the obtained mixture,
(3) moulding the calcined mixture under pressure, and
(4) sintering at temperatures of 900° to 1100° C.

5. A process for producing a low temperature sintered ceramic body consisting essentially of magnesium oxide, boron oxide and a fluoride of an alkaline earth metal and optionally one or more materials selected from the group consisting of lithium oxide, sodium oxide, potassium oxide and a fluoride of an alkali metal, said process consisting essentially of the steps of:

(1) mixing principal compound materials consisting essentially of a magnesium oxide precursor material changed to magnesium oxide by calcining and a boron oxide precursor material changed to boron oxide by calcining and assisting compound materials consisting essentially of a fluoride of an alkaline earth metal and optionally one or more materials selected from lithium oxide, sodium oxide, potassium oxide, a fluoride of an alkali metal, to contain 50 to 90 mol % of said magnesium oxide and 10 to 50 mol % of said boron oxide based on 100 mol % of the total amount of said principal compound materials after sintering, said principal compound materials being 85 to 99 mol % and said assisting compound materials being 1 to 15 mol % based on 100 mol % of the total of said principal and assisting compound materials, (2) calcining the obtained mixture,
(3) moulding the calcined mixture under pressure, and
(4) sintering at temperatures of 900° to 1100° C.

* * * * *

UNITED STATES PATENT AND TRADEMARK OFFICE
CERTIFICATE OF CORRECTION

PATENT NO. : 4,829,029
DATED : May 9, 1989
INVENTOR(S) : KAWAHARA et al

It is certified that error appears in the above-identified patent and that said Letters Patent is hereby corrected as shown below:

Column 7, line 55, change "test=sample" to --test sample--.

Column 11, line 28, insert --Table 2-- before "is".

Claim 1, column 14, line 24, change "$BH_2O_3$" to --$B_2O_3$-- and line 25, insert --of-- after "%".

Signed and Sealed this

Twenty-seventh Day of March, 1990

Attest:

JEFFREY M. SAMUELS

*Attesting Officer*  *Acting Commissioner of Patents and Trademarks*